US008945818B2

(12) United States Patent
Ishizuka

(10) Patent No.: US 8,945,818 B2
(45) Date of Patent: Feb. 3, 2015

(54) METHOD OF MANUFACTURING LIQUID EJECTION HEAD

(71) Applicant: Canon Kabushiki Kaisha, Tokyo (JP)

(72) Inventor: Kazunari Ishizuka, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/266,483

(22) Filed: Apr. 30, 2014

(65) Prior Publication Data

US 2014/0329181 A1 Nov. 6, 2014

(30) Foreign Application Priority Data

May 2, 2013 (JP) ................................ 2013-096855

(51) Int. Cl.
*B41J 2/16* (2006.01)

(52) U.S. Cl.
USPC .......................................................... 430/320

(58) Field of Classification Search
None
See application file for complete search history.

(56) References Cited

U.S. PATENT DOCUMENTS

2009/0291398 A1* 11/2009 Horiuchi ...................... 430/320
2011/0316188 A1* 12/2011 Ishikura ...................... 264/219
2013/0183450 A1* 7/2013 Bernard et al. ............... 427/402

FOREIGN PATENT DOCUMENTS

JP 3143307 B2 3/2001
JP 2005-242318 A 9/2005

* cited by examiner

*Primary Examiner* — John A. McPherson
(74) *Attorney, Agent, or Firm* — Canon USA, Inc. IP Division

(57) ABSTRACT

A method of manufacturing a liquid ejection head, and the method includes a process of providing a first photosensitive resin layer containing a photodegradable positive photosensitive resin and serving as a mold material of the channel on a substrate, a process of providing a gas barrier layer having a film density of 1 g/cm$^3$ or more on the first photosensitive resin layer, a process of subjecting the first photosensitive resin layer and the gas barrier layer to pattern exposure, and then performing development to thereby form the mold material of a channel and also removing the gas barrier layer before or simultaneously with the development, a process of providing a second photosensitive resin layer on the mold material and the substrate, a process of subjecting the second photosensitive resin layer to pattern exposure, and then performing development, and a process of removing the mold material of the channel.

11 Claims, 2 Drawing Sheets

6

METHOD OF MANUFACTURING LIQUID EJECTION HEAD

BACKGROUND OF THE INVENTION

1. Field of the Invention

The present invention relates to a method of manufacturing a liquid ejection head.

2. Description of the Related Art

One example of the liquid ejection head includes an ink jet recording head to be applied to an ink jet recording method of performing recording by ejecting ink to a medium to be recorded. A method of producing the ink jet recording head includes a method in Japanese Patent No. 3143307, for example. According to the method, a positive photosensitive resin layer laminated on a substrate is exposed, development is performed to form a mold material of an ink channel, a coating layer which covers the mold material is provided, and then the coating layer is exposed to form ejection ports. The positive photosensitive resin is removed, and then the coating layer is cured to produce the ink jet recording head.

Japanese Patent No. 3143307 discloses forming the positive photosensitive resin layer on a substrate provided with a supply port. Specifically, a solution in which the positive photosensitive resin is dissolved in a suitable solvent is applied onto a film of PET (polyethylene terephthalate) or the like, and then dried to produce a dry film. Then, the dry film is transferred by a lamination method. Moreover, it is disclosed that a vinyl ketone photodegradable resist, such as polymethyl isopropenyl ketone or vinyl ketone, which has a coating property as a high molecular weight compound before irradiation with light, and can be easily laminated on the supply port is preferable as the positive photosensitive resin. Furthermore, as the positive photosensitive resin, a photodegradable resist having solvent resistance is used from the balance with a coating layer material.

On the other hand, the variation of the ink jet recording head has increased in recent years. As the film thickness of the positive photosensitive resin layer serving as the mold material of the ink channel, the film thickness exceeding 15 μm is required in many cases. Particularly in this case, the energy required for exposure is high, the generation of decomposed matter of the photodegradable resist is not negligible. The decomposed matter contaminates the inside of an exposure apparatus, particularly adheres to an exposure mask to scatter light to cause reduction in patterning properties. Therefore, in a manufacturing process, washing of the mask is periodically required, so that the production efficiency sharply decreases due to the washing of the mask. A method of preventing the contamination of the inside of the exposure apparatus caused by gas generated from the resist in such exposure includes a method described in Japanese Patent Laid-Open No. 2005-242318. Japanese Patent Laid-Open No. 2005-242318 discloses a method of forming, on a chemistry amplification type resist film, a water-soluble film containing a water-soluble polymer whose gas permeability is lower than that of the resist, and then performing pattern exposure to thereby capture the gas generated in the exposure by a water-soluble polymer.

SUMMARY OF THE INVENTION

A method of manufacturing a liquid ejection head according to the invention is a method of manufacturing a liquid ejection head having a substrate and an ejection port formation member in which a liquid channel is formed between the member and the substrate and ejection ports which communicate with the channel and eject liquid are provided, and the method includes a process of providing a first photosensitive resin layer containing a photodegradable positive photosensitive resin and serving as a mold material of the channel on the substrate, a process of providing a gas barrier layer having a film density of 1 g/cm$^3$ or more on the first photosensitive resin layer, a process of subjecting the first photosensitive resin layer and the gas barrier layer to pattern exposure, and then performing development to thereby form the mold material of the channel and also removing the gas barrier layer before or simultaneously with the development, a process of providing a second photosensitive resin layer serving as the ejection port formation member on the mold material of the channel and the substrate, a process of subjecting the second photosensitive resin layer to pattern exposure, and then performing development to thereby form the ejection ports, and a process of removing the mold material of the channel to form the channel.

Further features of the present invention will become apparent from the following description of exemplary embodiments with reference to the attached drawings.

DESCRIPTION OF THE EMBODIMENTS

Figure 1:
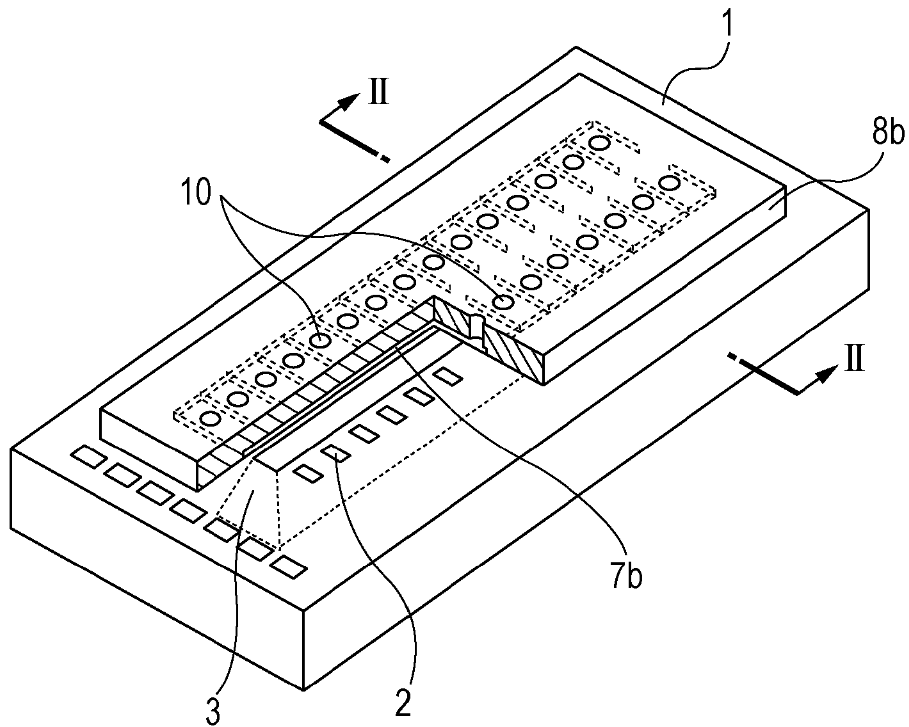
FIG. 1 is a perspective view illustrating one example of an ink jet recording head manufactured by a method according to the invention.

According to the method described in Japanese Patent Laid-Open No. 2005-242318, the affinity of gas of an acid leaving group generated when a chemistry amplification type resist is exposed and a water-soluble polymer is high, and therefore the gas can be captured by the water-soluble film. However, the affinity of decomposed matter generated when a photodegradable resist is exposed and a water-soluble polymer is low. Therefore, even when a water-soluble film is formed on the photodegradable resist film, the decomposed matter of the photodegradable resist generated in the exposure cannot be captured. The present invention has been made in view of the above-described problems. The present invention provides a method of manufacturing a liquid ejection head with high production efficiency.

A method of manufacturing a liquid ejection head according to the invention is a method of manufacturing a liquid ejection head having a substrate and an ejection port formation member in which a liquid channel is formed between the member and the substrate and ejection ports which communicate with the channel and eject liquid are provided, and the method includes a process of providing a first photosensitive resin layer containing a photodegradable positive photosensitive resin and serving as a mold material of the channel on the substrate, a process of providing a gas barrier layer having a film density of 1 g/cm$^3$ or more on the first photosensitive resin layer, a process of subjecting the first photosensitive resin layer and the gas barrier layer to pattern exposure, and then performing development to thereby form the mold material of the channel and also removing the gas barrier layer before or simultaneously with the development, a process of providing a second photosensitive resin layer serving as the ejection port formation member on the mold material of the channel and the substrate, a process of subjecting the second photosensitive resin layer to pattern exposure, and then performing development to thereby form the ejection ports, and a process of removing the mold material of the channel to form the channel.

According to the method of the invention, the gas barrier layer having a film density of 1 g/cm$^3$ or more is provided on the first photosensitive resin layer. Since the gas barrier layer has a film density of 1 g/cm$^3$ or more, the gas barrier layer is difficult to transmit decomposed matter of the positive photosensitive resin contained in the first photosensitive resin layer generated in the exposure of the first photosensitive resin layer. Thus, the contamination of the inside of an exposure apparatus and a mask due to the adhesion of the decomposed matter to the inside of the exposure apparatus or the mask can be prevented. Therefore, the number of times of mask washing in the manufacturing process can be reduced, so that the load in manufacturing is reduced, and consequently high production efficiency can be achieved.

Hereinafter, an embodiment of the invention is described with reference to the drawings. The following description describes an ink jet recording head which is one example of the liquid ejection head. However, the liquid ejection head according to the invention is not limited to the ink jet recording head and can be applied to various industrial fields, such as circuit formation, in addition to the printing field. In the following description, members having the same function are designated by the same reference numerals in the drawings and the description may be omitted.

Figure 2:
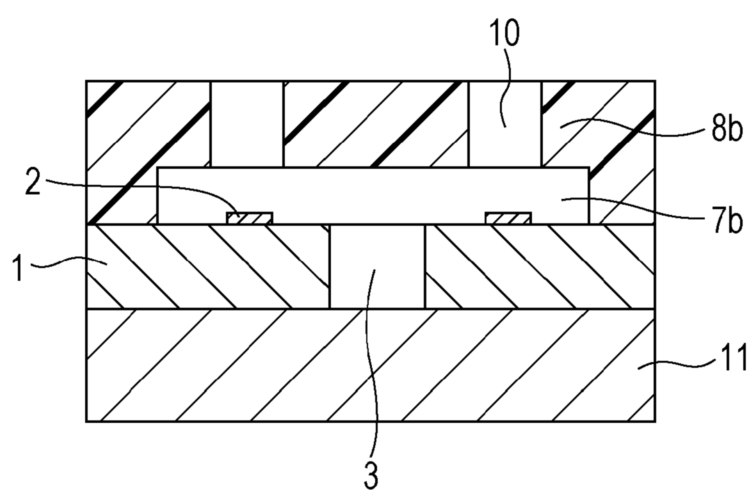
FIG. 2 is a cross sectional view illustrating one example of the ink jet recording head manufactured by the method according to the invention in which a supply member is disposed.

One example of the ink jet recording head manufactured by the method according to the invention is illustrated in FIG. 1. FIG. 2 is a view illustrating the II-II cross section in FIG. 1 of the ink jet recording head in which a supply member 11 which supplies ink is bonded to the back surface of a substrate 1 of the ink jet recording head illustrated in FIG. 1. The ink jet recording head illustrated in FIG. 1 and FIG. 2 has an ejection port formation member 8*b* on the substrate 1 on which a plurality of energy generating elements 2 for ejecting ink are disposed. The ejection port formation member 8*b* forms a channel 7*b* which holds ink between the ejection port formation member 8*b* and the substrate 1 and has ejection ports 10 which communicate with the channel 7*b* and eject ink. Moreover, the substrate 1 is provided with a supply port 3 which supplies ink to the channel 7*b*.

Hereinafter, each process in the method of manufacturing the ink jet recording head which is one embodiment of the invention is described with reference to FIGS. 3A to 3H. FIGS. 3A to 3H each are cross sectional views in each process equivalent to the II-II cross section of the ink jet recording head illustrated in FIG. 1.

Formation Process of First Photosensitive Resin Layer

Figure 3A:
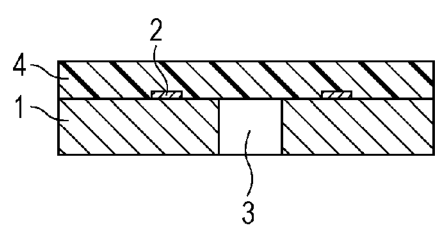
FIGS. 3A to 3H each are cross sectional views illustrating each process of a method of manufacturing an ink jet recording head which is one embodiment of the method according to the invention.

First, a first photosensitive resin layer 4 is formed on the substrate 1 on which the energy generating elements 2 and the supply port 3 are formed (FIG. 3A). As the substrate 1, a silicon substrate can be used. As the energy generating element 2, a heater containing WSiN can be used, for example. On the front surface of the substrate 1, a nitride film of silicon, an oxide film of silicon, a carbide film of silicon, and a metal film of Ta or the like, for example, may be provided as a protective film of the energy generating elements 2. The supply port 3 may not be formed in this stage.

The first photosensitive resin layer 4 is a layer serving as the mold material of the channel and contains a positive photosensitive resin. As the positive photosensitive resin, a photodegradable positive photosensitive resin is used which is a material which can be laminated on the substrate 1 in which the supply port 3 is formed, is not compatible with a second photosensitive resin layer 8*a* described later, and has solvent resistance. As the positive photosensitive resin, when ultraviolet rays are used in the exposure of the second photosensitive resin layer 8*a* described later, a material is preferable which has low absorbance to the ultraviolet rays is low and has sensitivity to the active energy rays whose wavelength is shorter than that of the ultraviolet rays, for example, Deep UV light and the like. As the material, polymethyl isopropenyl ketone, polymethyl methacrylate, and the like which can be exposed with the Deep UV light are mentioned, for example. As a commercially-available item, "ODUR-1010" (Trade name, manufactured by TOKYO OHKA KOGYO CO., LTD.) is mentioned as polymethyl isopropenyl ketone, for example. These materials may be used singly or in combination of two or more kinds thereof. The formation method of the first photosensitive resin layer 4 includes, for example, dissolving a photodegradable positive photosensitive resin in a solvent as appropriate, applying the solution onto a film of PET or the like, and then drying the same to produce a dry film. By transferring the dry film onto the substrate 1 by a lamination method, and then performing pre-baking, the first photosensitive resin layer 4 can be formed. The thickness of the first photosensitive resin layer 4 is equivalent to the height of the channel and can be set to 5 to 25 μm, for example, but is not particularly limited thereto. From the viewpoint of sufficiently obtaining the effects of the invention, the film thickness of the first photosensitive resin layer 4 preferably exceeds 15 μm.

Formation Process of Gas Barrier Layer

Figure 3B:
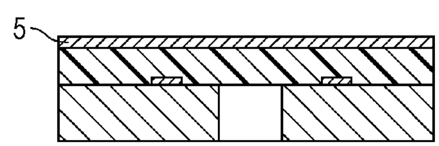

Next, a gas barrier layer 5 is formed on the first photosensitive resin layer 4 (FIG. 3B). In the invention, by forming the gas barrier layer 5 on the first photosensitive resin layer 4, decomposed matter of the first photosensitive resin layer 4 generated in performing pattern exposure of the first photosensitive resin layer 4 described later is blocked on the interface of the first photosensitive resin layer 4 and the gas barrier layer 5. Thus, the contamination of the inside of the exposure apparatus by the decomposed matter is prevented, and particularly the adhesion of the decomposed matter to the mask 6 can be suppressed.

The gas barrier layer 5 has a film density of 1 g/cm$^3$ or more. When the film density is less than 1 g/cm$^3$, the decomposed matter of the first photosensitive resin layer 4 cannot be sufficiently blocked. The film density is preferably 1.2 g/cm$^3$ or more, more preferably 1.3 g/cm$^3$ or more, and still more preferably 1.5 g/cm$^3$ or more. The film density is preferably 2 g/cm$^3$ or less from the viewpoint of removability. However, the film density is not limited thereto depending on the material of the gas barrier layer or a removing solution. The film density is a value measured by an X ray reflectivity measuring method.

On the other hand, when the film density is 1 g/cm$^3$ or less, the material of the gas barrier layer 5 is not particularly limited. However, when performing pattern exposure of the first photosensitive resin layer 4 whose film thickness exceeds 15 μm, for example, the exposure energy is high. Depending on the material of the gas barrier layer 5, the material absorbs the energy, and therefore the molecule movement becomes great. Thus, the free space of the gas barrier layer 5 becomes large, and it is considered that the capability of blocking the decomposed matter of the first photosensitive resin layer 4 decreases. From this viewpoint, the use of a compound having an inorganic skeleton as the material of the gas barrier layer 5 is preferable because the molecule movement to the exposure energy is relatively small. As the compound having an inorganic skeleton, polysilane, polysiloxane, and the like are preferable. As the polysilane, dimethyl polysilane and the like are mentioned. As the polysiloxane, polydimethyl siloxane and the like are mentioned. These compounds may be used singly or in combination of two or more kinds thereof. The weight average molecular weight of the polysilane is preferably 100,000 or more and 200,000 or less. The weight average molecular weight of the polysiloxane is preferably 100,000 or more and 200,000 or less. The molecular weight is a value measured by gel permeation chromatograph.

With respect to the film thickness of the gas barrier layer 5, when the film thickness of the gas barrier layer 5 is large, the effect of blocking the decomposed matter of the first photosensitive resin layer 4 becomes higher but the absorption of light increases, which sometimes affects the exposure of the first photosensitive resin layer 4. For example, when the positive photosensitive resin contained in the first photosensitive resin layer 4 is polymethyl isopropenyl ketone, the resin has sensitivity in the wavelength region of 280 nm or more and 320 nm or less. Therefore, in this case, the fact that the average absorbance of the gas barrier layer 5 to the light in the wavelength region mentioned above is 0.05 or less is preferable because the exposure is not affected. Within the range of the average absorbance mentioned above, the film thickness can also be increased. The average absorbance is more preferably 0.04 or less and still more preferably 0.03 or less. The lower limit of the average absorbance is not particularly limited. The average absorbance is a value measured by a spectrum photometer.

The gas barrier layer 5 can be formed by applying a solution in which the material of the gas barrier layer 5 is dissolved in a solvent onto the first photosensitive resin layer 4, drying, and then performing pre-baking as required, for example. The solution can be applied by a spin coating method, for example. As the solvent which dissolves the material of the gas barrier layer 5, the compatibility with the first photosensitive resin layer 4 is required to be low. For example, when the positive photosensitive resin contained in the first photosensitive resin layer 4 is polymethyl isopropenyl ketone, xylene is preferable as the solvent.

Formation of Mold Material of Channel and Removal Process of Gas Barrier Layer

Figure 3C:
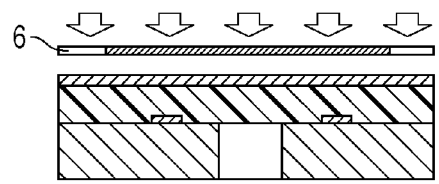
Figure 3D:
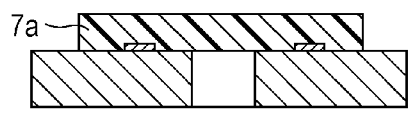

Next, the first photosensitive resin layer 4 and the gas barrier layer 5 are subjected to pattern exposure (FIG. 3C), and then development is performed to thereby form a mold material 7*a* of the channel. The gas barrier layer 5 is removed before or simultaneously with the development (FIG. 3D). A method of patterning the first photosensitive resin layer 4 includes irradiating the first photosensitive resin layer 4 and the gas barrier layer 5 with active energy rays which can expose the first photosensitive resin layer 4 through a mask 6 to perform pattern exposure. As the active energy rays, Deep UV light can be used, for example, depending on the positive photosensitive resin contained in the first photosensitive resin layer 4. The exposure amount can be set to 15 to 30 $J/cm^2$, for example. When the gas barrier layer 5 can be decomposed with the active energy rays, the exposure can be performed using a filter or the like capable of cutting the wavelength region in which the gas barrier layer 5 can be decomposed depending on the degree of the decomposition. Thereafter, by performing development using a solvent or the like which can dissolve the exposed portion of the first photosensitive resin layer 4, and then performing rinse treatment, the mold material 7*a* can be formed. When removing the gas barrier layer 5 before the development, the gas barrier layer 5 can be removed using the solvent capable of dissolving the gas barrier layer 5. When removing the gas barrier layer 5 simultaneously with the development, the exposed portion of the first photosensitive resin layer 4 and the gas barrier layer 5 can be simultaneously removed with a solvent capable of dissolving the exposed portion of the first photosensitive resin layer 4. The removal of the gas barrier layer 5 is preferably performed simultaneously with the development from the viewpoint that the manufacturing process can be simplified.

Formation Process of Second Photosensitive Resin Layer

Figure 3E:
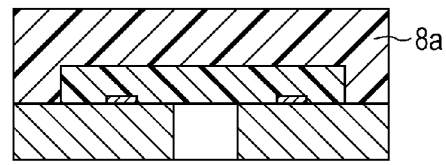

Next, the second photosensitive resin layer 8*a* serving as the ejection port formation member is formed on the mold material 7*a* and the substrate 1 (FIG. 3E). It is preferable for the second photosensitive resin layer 8*a* to contain a negative photosensitive resin from the viewpoint of ink durability and the like. As the negative photosensitive resin, an epoxy resin and the like can be used, for example. As a commercially-available item, "EHPE-3150" (Trade name, manufactured by Daicel Corporation) and the like can be used, for example. These substances may be used singly or in combination of two or more kinds thereof. The second photosensitive resin layer 8*a* can be formed by applying a solution in which the material of the second photosensitive resin layer 8*a* is dissolved in a solvent as appropriate onto the mold material 7*a* and the substrate 1 by a spin coating method, for example. When using a solvent, a solvent which does not dissolve the mold material 7*a* is selected and used. The thickness of the second photosensitive resin layer 8*a* is not particularly limited insofar as the development properties of the ejection port portions are not impaired. The thickness of the second photosensitive resin layer 8*a* on the mold material 7*a* can be set to 10 to 50 μm, for example.

Formation Process of Ejection Ports

Figure 3F:
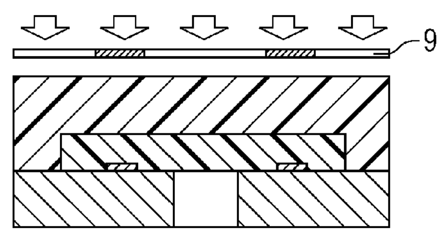
Figure 3G:
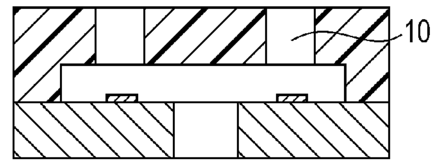

Next, the second photosensitive resin layer 8*a* is subjected to pattern exposure through a mask 9 (FIG. 3F), and thereafter development is performed to thereby form the ejection ports 10 (FIG. 3G). For the light, the active energy rays of the photosensitive wavelength of the second photosensitive resin layer 8*a* can be used and, for example, ultraviolet rays can be used. As the ultraviolet rays, i rays can be used, for example. The exposure amount can be set to 3000 to 5000 $mJ/cm^2$, for example, depending on the material, the film thickness, and the like of the second photosensitive resin layer 8*a*. After the exposure, post exposure (PEB) may be performed.

Formation Process of Channel

Figure 3H:
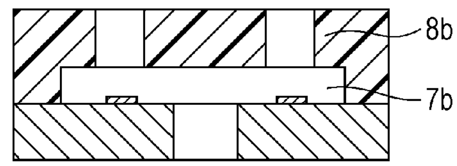

Next, the channel 7*b* is formed by removing the mold material 7*a*. Furthermore, the second photosensitive resin layer 8*a* is completely cured by baking treatment to form the ejection port formation member 8*b* (FIG. 3H). The mold material 7*a* can be removed by, for example, immersing the substrate 1 in a solvent capable of dissolving the mold material 7*a*. As required, by exposing the mold material 7*a* is exposed using the active energy rays which can expose the mold material 7*a*, the solubility of the mold material 7*a* may be improved beforehand. Ultrasonic waves may be given to the solvent in the immersion of the substrate 1.

Then, electric bonding for driving the energy generating elements 2 is performed. Furthermore, the supply member 11 for ink supply and the like are connected to complete an ink jet recording head.

The ink jet recording head manufactured by the method according to the invention can be mounted in apparatuses, such as a printer, a copying machine, a facsimile having a communication system, and a word processor having a printer portion, an industrial recording apparatus complexly combined with various treatment units, and the like. By the use of the ink jet recording head manufactured by the method according to the invention, recording can be performed on various media to be recorded, such as paper, thread, fiber, leather, metal, plastic, glass, wood, and ceramics.

EXAMPLES

Hereinafter, the invention is described with reference to Examples but the invention is not limited to Examples.

Evaluation 50 silicon substrates were continuously treated by the method of this example, and then ink jet recording heads were produced from all the silicon substrates. Each ink jet recording head was placed in a recording apparatus. In the evaluation, ruled line printing and dot printing were performed using an ink containing pure water/diethylene glycol/isopropyl alcohol/lithium acetate/black dye food black 2=79.4/15/3/0.1/2.5 (mass ratio). The produced ink jet recording head was cut along the II-II cross section illustrated in FIG. 1, and the shape of the channel 7*b* illustrated in FIG. 2 was observed under SEM (scanning electron microscope). Furthermore, in the production of the ink jet recording head, the mask after performing pattern exposure of the first photosensitive resin layer and the gas barrier layer was observed, and then it was confirmed whether or not the fogging of the mask occurred. Table 1 shows, in the continuous treatment of the silicon substrates, the number of the treated silicon substrate in which disorder was observed in printing, the number of the treated silicon substrate in which disorder was observed in the channel shape, and the number of the treated silicon substrate in which the fogging of the mask was observed.

Example 1

First, a blast mask was placed on the silicon substrate 1 on which heaters containing WSiN were disposed as the energy generating elements 2, and then the supply port 3 was formed by sandblast processing. An insulating film was provided on the energy generating elements 2, and a protective film of Ta was provided on the insulating film. Subsequently, polymethyl isopropenyl ketone (Trade name: "ODUR-1010", manufactured by TOKYO OHKA KOGYO CO., LTD.) was applied as a positive photosensitive resin onto PET, and then dried to produce a dry film. Then, the dry film was transferred onto the silicon substrate 1 by a lamination method. Then, pre-baking was performed at 120° C. for 6 minutes to form the first photosensitive resin layer (FIG. 3A). Subsequently, a solution in which 2.5% by mass of dimethyl polysilane (manufactured by Wako Pure Chemical Industries, Ltd., Weight average molecular weight: 150,000) as a material of a gas barrier layer was dissolved in xylene was applied onto the first photosensitive resin layer 4 by a spin coating method. Thereafter, pre-baking was performed at 110° C. for 3 minutes to form the gas barrier layer 5 (FIG. 3B). The film density of the gas barrier layer 5 was 1.5 g/cm$^3$. The average absorbance of the gas barrier layer 5 to light having a wavelength of 280 nm or more and 320 nm or less was 0.03.

Subsequently, pattern exposure (Deep UV light, Exposure amount: 30 J/cm$^2$) of the mold material 7*a* was performed through the mask 6 to the first photosensitive resin layer 4 and the gas barrier layer 5 with a Deep UV exposure apparatus (Trade name: "UX-3000", manufactured by USHIO, INC.) (FIG. 3C). Considering the decomposition of dimethyl polysilane, a filter which cuts the wavelength of 250 nm or less was used. Thereafter, the development was performed using methyl isobutyl ketone, and then rinse treatment was performed using IPA (isopropyl alcohol). Thus, the mold material 7*a* was formed (FIG. 3D). In the development, the gas barrier layer 5 was also simultaneously removed. The film thickness of the mold material 7*a* was 20 μm.

Subsequently, the following resin composition 1 was dissolved in xylene in such a manner as to have a concentration of 50% by mass.

Resin Composition 1

EHPE-3150 (Trade name, manufactured by Daicel Corporation) 100 parts by mass

A-187 (Trade name, manufactured by Toray Industries, Dow Corning) 5 parts by mass SP-172 (Trade name, manufactured by ADEKA) 1.5 parts by mass The solution was applied onto the mold material 7*a* and the silicon substrate 1 by a spin coating method to form the second photosensitive resin layer 8*a* (FIG. 3E). The film thickness of the second photosensitive resin layer 8*a* on the mold material 7*a* was 20 μm.

Subsequently, the second photosensitive resin layer 8*a* was subjected to pattern exposure (i rays, Exposure amount: 5000 J/(m$^2$)) through the mask 9 using an i ray stepper exposure apparatus (Trade name: i5, manufactured by CANON KABUSHIKI KAISHA) (FIG. 3F). Thereafter, after the exposure, baking (PEB) was performed at 90° C. for 4 minutes, and then development was performed by methyl isobutyl ketone to thereby form the ejection ports 10 of ϕ12 μm (FIG. 3G). The mold material 7*a* remained in this stage. Since a plurality of ink jet recording heads having the same shape or different shapes were disposed on the silicon substrate 1, the silicon substrate 1 was cut by a dicer in this stage to separate the ink jet recording heads into an individual ink jet recording head. In this stage, since the mold material 7*a* remained as described above, residual substances (wastes) generated in cutting can be prevented from entering the ink jet recording heads.

Subsequently, exposure (Deep UV light, Exposure amount: 27 J/(cm$^2$)) was performed again with a Deep UV exposure apparatus (Trade name: "UX-3000", manufactured by USHIO, INC.). Thereafter, the silicon substrate 1 was immersed in methyl lactate while applying ultrasonic waves to elute the remaining mold material 7*a*. Subsequently, heating was performed at 200° C. for 1 hour to completely cure the second photosensitive resin layer 8*a* to form the ejection port formation member 8*b* (FIG. 3H). Finally, the supply member 11 was bonded to the back surface of the silicon substrate 1 in which the supply port 3 was formed to produce the ink jet recording head. The evaluation results are shown in Table 1.

Example 2

In the formation of the gas barrier layer 5, a solution was used in which 2.5% by mass of polydimethyl siloxane (manufactured by Wako Pure Chemical Industries, Ltd., Weight average molecular weight: 139,000) as a material of the gas barrier layer was dissolved in xylene. An ink jet recording head was produced and evaluated in the same manner as in Example 1, except the process above. The results are shown in Table 1.

Comparative Example 1

An ink jet recording head was produced and evaluated in the same manner as in Example 1, except not forming the gas barrier layer 5. The results are shown in Table 1.

Comparative Example 2

An ink jet recording head was produced and evaluated in the same manner as in Example 1, except using a solution in which 2.5% by mass of polyaclylic acid (manufactured by Wako Pure Chemical Industries, Ltd.) as a material of the gas barrier layer was dissolved in xylene in the formation of the gas barrier layer 5. The results are shown in Table 1.

TABLE 1

| | Positive photosensitive layer Material | Gas barrier layer Material | Film density ($g/cm^3$) | Average absorbance (—) | Evaluation: Print disorder (Number of sheet) | Channel shape disorder (Number of sheet) | Mask fogging (Number of sheet) |
|---|---|---|---|---|---|---|---|
| Ex. 1 | Polymethyl isopropenyl ketone | Dimethyl polysilane | 1.5 | 0.03 | 35 | 35 | 35 |
| Ex. 2 | | Polydimethyl siloxane | 1.3 | 0.03 | 30 | 30 | 30 |
| Comp. Ex. 1 | | — | — | — | 12 | 12 | 12 |
| Comp. Ex. 2 | | Polyacrylic acid | 0.7 | 0.03 | 13 | 13 | 13 |

Table 1 shows that the number of the treated sheet in which print disorder, channel shape disorder, and mask fogging were observed was in agreement with each other in each of Examples and Comparative Examples. When decomposed matter of the positive photosensitive resin adhered to the mask when the first photosensitive resin layer and the gas barrier layer were subjected to pattern exposure, the decomposed matter was observed as mask fogging. Then, the light of the pattern exposure was scattered by the adherent to cause disorder in the channel shape. Consequently, it is considered that disorder further occurred in printing.

In Comparative Example 1 in which the gas barrier layer was not formed, when 12 silicon substrates were treated, decomposed matter of the positive photosensitive resin adhered to the mask. In Comparative Example 2 in which polyacrylic acid was used as the material of the gas barrier layer, when 13 silicon substrates were treated, decomposed matter of the positive photosensitive resin adhered to the mask. As compared with Comparative Example 1, the number of the treated sheets slightly increased. This shows that the increase is achieved by the effect of the gas barrier layer containing polyacrylic acid but the effect is low. On the other hand, the number of the treated sheets is twice or more in Examples 1 and 2 in which dimethyl polysilane or polydimethyl siloxane was used as the material of the gas barrier layer as compared with Comparative Examples, which shows that decomposed matter of the positive photosensitive resin is hard to adhere to the mask. Then, it is found that the difference in the film density of the gas barrier layer is involved in the effect.

The invention can provide a method of manufacturing a liquid ejection head with high efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-096855, filed May 2, 2013 which is hereby incorporated by reference herein in its entirety.

What is claimed is:

1. A method of manufacturing a liquid ejection head having a substrate and an ejection port formation member in which a liquid channel is formed between the member and the substrate and ejection ports which communicate with the channel and eject liquid are provided, the method comprising:

providing a first photosensitive resin layer containing a photodegradable positive photosensitive resin and serving as a mold material of the channel on the substrate;

providing a gas barrier layer having a film density of 1 $g/cm^3$ or more on the first photosensitive resin layer;

subjecting the first photosensitive resin layer and the gas barrier layer to pattern exposure, and then performing development to thereby form a mold material of the channel and also removing the gas barrier layer before or simultaneously with the development;

providing a second photosensitive resin layer serving as the ejection port formation member on the mold material of the channel and the substrate;

subjecting the second photosensitive resin layer to pattern exposure, and then performing development to thereby form the ejection ports; and removing the mold material of the channel to form the channel.

2. The method of manufacturing a liquid ejection head according to claim 1, wherein the gas barrier layer contains a compound having an inorganic skeleton.

3. The method of manufacturing a liquid ejection head according to claim 2, wherein the compound having an inorganic skeleton is polysilane.

4. The method of manufacturing a liquid ejection head according to claim 2, wherein the compound having an inorganic skeleton is polysiloxane.

5. The method of manufacturing a liquid ejection head according to claim 1, wherein the positive photosensitive resin is polymethyl isopropenyl ketone.

6. The method of manufacturing a liquid ejection head according to claim 5, wherein an average absorbance of the gas barrier layer to light of a wavelength of 280 nm or more and 320 nm or less is 0.05 or less.

7. The method of manufacturing a liquid ejection head according to claim 5, wherein the gas barrier layer is a layer formed by applying a solution in which a material of the gas barrier layer is dissolved in xylene onto the first photosensitive resin layer, and then drying the same.

8. The method of manufacturing a liquid ejection head according to claim 1, wherein, in removing the gas barrier layer, the gas barrier layer is removed simultaneously with the development.

9. The method of manufacturing a liquid ejection head according to claim 1, wherein the second photosensitive resin layer contains a negative photosensitive resin.

10. The method of manufacturing a liquid ejection head according to claim 1, wherein a film density of the gas barrier layer is 1.2 g/cm$^3$ or more.

11. The method of manufacturing a liquid ejection head according to claim 1, wherein a film thickness of the first photosensitive resin layer exceeds 15 μm.

* * * * *